United States Patent [19]

Ueda et al.

[11] Patent Number: 4,649,414
[45] Date of Patent: Mar. 10, 1987

[54] PNPN SEMICONDUCTOR SWITCHES

[75] Inventors: Jun Ueda; Hirokazu Tsukada; Yoichi Nanba, all of Tokyo, Japan

[73] Assignee: Oki Electric Industry Co., Ltd., Tokyo, Japan

[21] Appl. No.: 778,164

[22] Filed: Sep. 18, 1985

Related U.S. Application Data

[63] Continuation of Ser. No. 415,920, Sep. 8, 1982, abandoned.

[30] Foreign Application Priority Data

Sep. 14, 1981 [JP] Japan ............... 56-143934

[51] Int. Cl.$^4$ .............................. H01L 29/40
[52] U.S. Cl. ........................ 357/53; 357/38; 357/35; 357/43; 357/51; 357/59
[58] Field of Search ............. 357/38, 35, 59, 51, 357/53, 43

[56] References Cited

U.S. PATENT DOCUMENTS

| 3,432,731 | 3/1969 | Whittier | 357/53 |
| 3,858,235 | 12/1974 | Schild | 357/53 |
| 4,244,000 | 1/1981 | Ueda et al. | 357/38 |
| 4,414,560 | 11/1983 | Lidow | 357/53 |

FOREIGN PATENT DOCUMENTS 300472 4/1968 Sweden .............. 357/53

OTHER PUBLICATIONS

F. Perner et al., "MOS Gate Turn–Off Cateral Scr," IBM Tech. Discl. Bull., vol. 20, #6, Nov. 1977, pp. 2273, 2274.

J. Ueda et al., "An Opt. – Coupl. . . . Sensitivity," IEEE Journal of Solid–State Circuits, vol. SC-16, No. 4, Aug. 1981, pp. 286-293.

Primary Examiner—Joseph E. Clawson, Jr.
Attorney, Agent, or Firm—Wenderoth, Lind & Ponack

[57] ABSTRACT

In a planer type PNPN semiconductor switch having a MOS FET structure, a field plate electrode is embedded in an insulator covering a surface of a semiconductor substrate to overlie an interface between the semiconductor substrate and a P gate region for limiting an extention of a depletion layer from an anode region to a P gate region.

4 Claims, 10 Drawing Figures

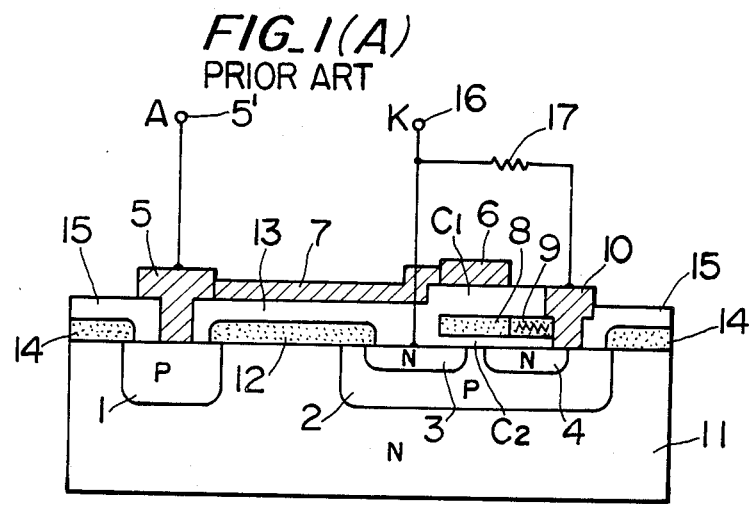
*FIG_1(A)*
PRIOR ART
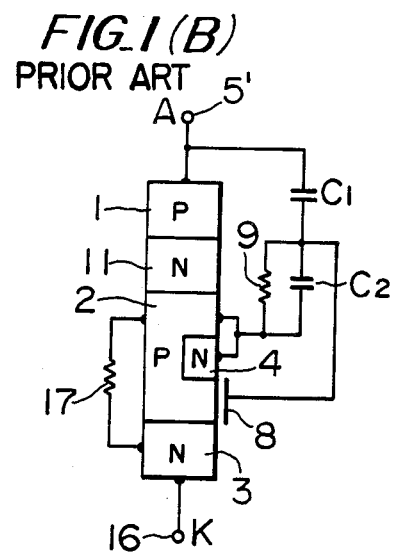
*FIG_1(B)*
PRIOR ART

FIG_3(A)
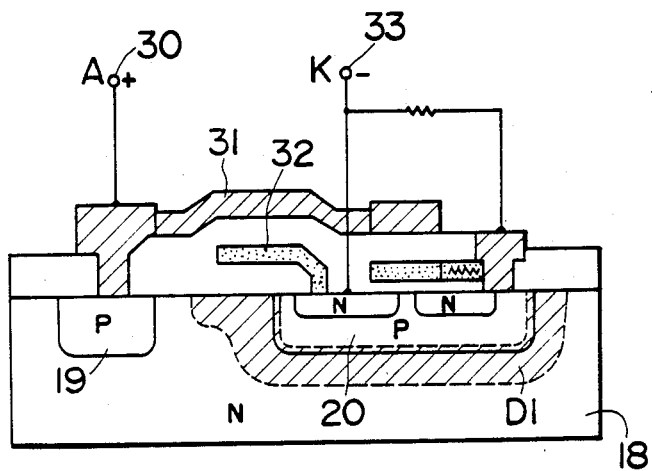
FIG_3(B)
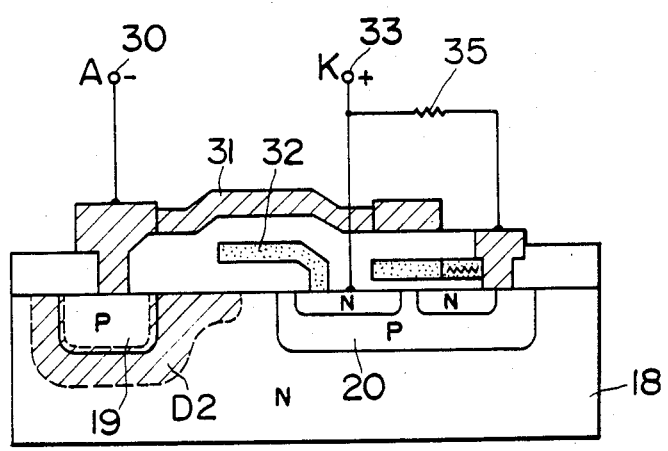

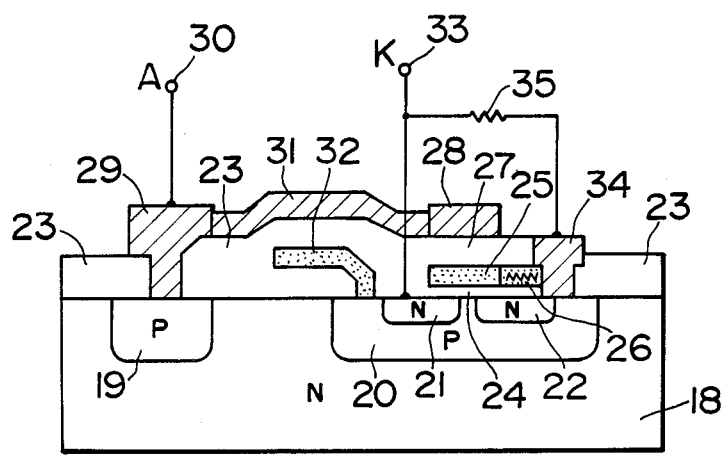
FIG_4

FIG_5(A)
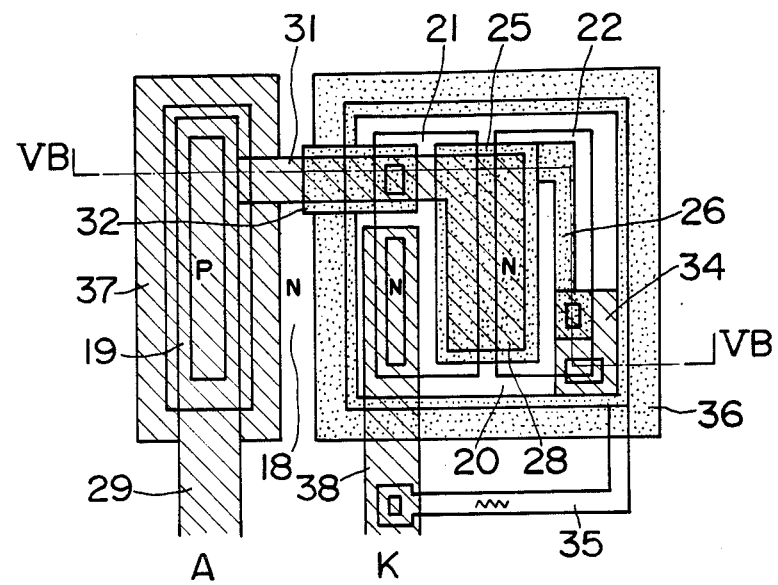
FIG_5(B)
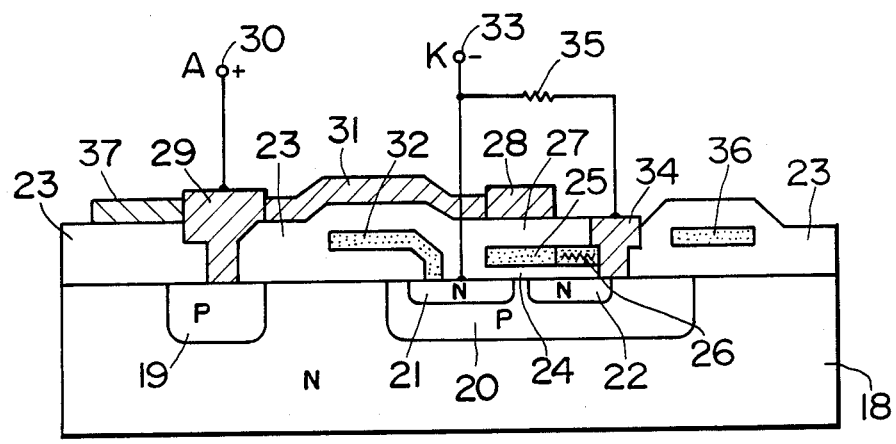

PNPN SEMICONDUCTOR SWITCHES

This application is a continuation of now abandoned application Ser. No. 415,920 filed Sept. 8, 1982.

BACKGROUND OF THE INVENTION

This invention relates to a PNPN semiconductor switch, more particularly, to a planer-type semiconductor switch with an MOS structure for the use in speech paths of an electronic telephone exchange or the like.

Generally, a PNPN semiconductor switch is triggered by injecting a gate current into a P gate region or by projecting light upon a PN junction between a P gate region and an N gate region (N type silicon substrate) for producing a photocurrent.

The performance of such a PNPN semiconductor switch is represented by its drive sensitivity, dv/dt capability and voltage resistance characteristics.

The drive sensitivity characteristic means a minimum gate current or a photocurrent that triggers the PNPN semiconductor switch and can be controlled by the value of a shunt resistance connected in parallel with the P gate electrode and the cathode electrode. Generally, a high shunt resistance value allows the PNPN semiconductor switch to be triggered with a small gate current or light.

However, when the drive sensitivity of the PNPN semiconductor switch is too high, and where an input voltage having a high rise time is impressed across the anode and cathode electrodes, without injecting a gate current into the P gate region or without projecting light, the PNPN semiconductor switch is often erroneously triggered due to a transient current generated at the PN junction inside of the PNPN semiconductor switch.

The dv/dt durability characteristic depends upon the value of the shunt resistance. Thus, if the value of the shunt resistance is small, the probability of misoperation is small, whereas as the value of the shunt resistance increases, erroneous operations are liable to occur. In this manner, in the PNPN semiconductor switch, the drive sensitivity characteristic and the dv/dt capability characteristic (difficult to misoperate due to dv/dt) conflict with each other.

Furthermore, the PNPN semiconductor switch is required to have high voltage resistance characteristics for both forward and reverse anode-cathode voltages. More particularly, where the breakdown voltages of PN junctions in the PNPN semiconductor switch are low, thus causing avalanche currents or a PNP portion and an NPN portion constituting the PNPN semiconductor switch accompany punch-through phenomena causing currents to flow, and such currents would cause the PNPN semiconductor switch to misoperate.

Unless all of the high voltage resistance characteristics, the high dv/dt capability characteristic and the high drive sensitivity characteristic are satisfied, a satisfactory PNPN semiconductor switch cannot be realized.

Among the devices which simultaneously satisfy the high dv/dt capability and the high drive sensitivity is a PNPN semiconductor switch provided with a MAC (MOS associated circuit) in which a planar type PNPN element and a MOS FET all integrally combined for preventing dv/dt misoperation.

The prior art PNPN semiconductor switch shown in FIG. 1A comprises a P type diffused region 1 acting as an anode region, a P type diffused region 2 acting as a P gate region, an N type diffused region 3 acting as the cathode region and a source region of a MOS FET, an N type diffused region 4 acting as the drain region of the MOS FET, an anode electrode 5, an anode terminal 5', an aluminum gate electrode 6, an aluminum conductor 7 interconnecting the anode electrode 5 and the aluminum gate electrode 6, a polycrystalline silicon gate electrode 8 of the MOS FET, a resistor 9 formed by changing the configuration of a portion of the polycrystalline silicon gate electrode, a P gate electrode 10 interconnecting the diffused regions 2 and 4, and an N type silicon substrate 11 acting as an N gate region. The semiconductor switch further comprises a semiinsulator film 12 formed on the surface of the N type silicon substrate 11 between the P type diffused regions 1 and 2, an insulating film 13, for example a silicon oxide film interposed between the semiinsulator film 12 and the aluminum conductor 7, a semiinsulator film 14 which, except for the area covered by semiinsulator film 12, is formed on the surface of the N type silicon substrate 11, an insulating film 15, a cathode electrode 16 led out from the N type diffused region 3 through an electrode not shown in FIG. 1A, and a shunt resistor 17 electrically interconnecting the cathode terminal 16 and the P gate electrode 10.

In the PNPN semiconductor switch described above, a capacitor $C_1$ is formed between the aluminum gate electrode 6 and the polycrystalline silicon gate electrode 8. Further, a capacitance $C_2$ is formed between the polycrystalline gate electrode 8 and the diffused regions 2, 3 and 4.

The P type diffused region 1, the N type silicon substrate 11, the P type diffused region 2 and the N type diffused region 3 constitute a PNPN element.

A two layer gate MOS FET is formed by using the N type diffused region 3 as the source region, the N type diffused region 4 as the drain region, the P type diffused region 2 as a substrate, and the gate electrodes 6 and 8 as a two layer gate electrode. In this MOS FET, the resistor 9 and the P gate electrode 10 constitute a MAC. The resistor 9 and the capacitors $C_1$ and $C_2$ form a discharge circuit of the polycrystalline silicon gate electrode 8 of the MOS FET with the MAC.

To improve the sensitivity characteristic of the PNPN semiconductor switch described above, the value of the shunt resistor 17 is usually selected to be large.

This PNPN semiconductor switch operates as follows.

Where an input voltage having a shorter rise time than the time constant of a RC circuit comprising the resistor 9 and the capacitors $C_1$ and $C_2$ is impressed across the anode and cathode electrodes, the diffused regions 2, 3 and 4 would have substantially the same potential as the cathode terminal 16 due to the provision of the P gate electrode 10 and the shunt resistor 17.

At this time, the potential of the polycrystalline silicon gate electrode 8 rises to a value determined by the voltage dividing action of the capacitors $C_1$ and $C_2$ and forms an N type channel on the surface of the P type diffused region 2 (P gate region) between two N type diffused regions 3 and 4, thus decreasing the impedance between the N type diffused regions 3 and 4, and hence that between the diffused regions 2 and 4. Thus, the impedance between the P gate electrode and the cathode electrode of the PNPN element becomes low so that the switch does not misoperate due to dv/dt.

The potential at the polycrystalline silicon gate electrode 8 discharges through a RC circuit including the resistor 9 and the capacitors $C_1$ and $C_2$. It is easy to set the time constant of the RC circuit to a length sufficient to prevent dv/dt misoperation of the switch by suitably selecting the shape of the polycrystalline silicon resistor 9 and the concentration of the impurity.

As described above the PNPN semiconductor switch shown in FIG. 1A has a high dv/dt capability characteristic.

The drive characteristic will now be considered. The PNPN semiconductor switch can be driven by either one of a light drive in which light is projected upon a PN junction between the N type silicon substrate 11 and the P type diffused region 2, a method in which drive current is applied to the P gate electrode 10, and a method in which the drive current is taken out from the N type silicon substrate 11. In each case, the drive sensitivity is determined by the impedance between the P gate electrode and the cathode electrode at the time of driving the PNPN element.

When driving the semiconductor switch, it is usual to impress direct current or low frequency alternating current between the anode and cathode electrodes. At this time, the potential of the polycrystalline silicon gate electrode 8 becomes equal to that of the P type diffused region 2 through the resistor 9 and the P gate electrode 10 which is different from the prior art dv/dt input application so that no channel would be formed between the N type diffused regions 3 and 4. Consequently, the impedance between the P gate electrode and the cathode electrode of the PNPN semiconductor element at the time of drive is determined only by the shunt resistor 17 so that the sensitivity of the semiconductor switch can be improved by increasing the value of the shunt resistor 17. As above described, a large value of the shunt resistor 17 does not affect the dv/dt durability.

In the PNPN semiconductor switch shown in FIG. 1A, a high voltage resistance characteristic under an off state is obtained by the provision of the semiinsulator film 12. It is now supposed that a reverse bias potential lower than that of the cathode terminal 16 is applied to the anode terminal 5'. Then, the PN junction between the P type diffused region 1 and the N type silicon substrate 11 will be biased reversely, thus forming a large depletion layer. In the absence of the semiinsulator film 12, the potential difference between the aluminum conductor 7 interconnecting the anode electrode 5 and the aluminum gate electrode 6 and the N type silicon substrate 11 beneath the conductor 7 would be substantially the same as the impressed voltage so that a depletion layer is formed on the surface of the N type silicon substrate 11 through the insulating film 13 and since this depletion layer is connected with the first mentioned depletion layer formed by the P type diffused layer 1 and the N type silicon substrate 11, the P type diffused regions 1 and 2 are connected through the depletion layers, whereby current flows due to a punch-through phenomenon to decrease the voltage resistance characteristic between the anode and cathode electrodes of the PNPN semiconductor element to an extremely small value. However, where the semiinsulator layer 12 is provided as shown in FIG. 1A, the aluminum conductor 7 prevents a depletion layer from being formed on the surface of the N type silicon substrate 11 with the result that the punch-through phenomenon would not occur between the P type diffused regions 1 and 2 and the PNPN semiconductor element manifests an excellent voltage resistance characteristic.

A term semiinsulating film usually means an insulating film having a resistivity of about $10^6$–$10^{10}$ ohm cm. On the other hand, the silicon substrate has a resistivity of 1–$10^2$ ohm cm, and an insulating film has a which is higher than at least $10^{14}$ ohm cm.

The semiinsulator film usually comprises a polycrystalline silicon film containing 10–50% of oxygen. However, the characteristics, such as the electrical conductivity, of a polycrystalline silicon film containing oxygen vary depending upon such factors as the content of oxygen, the conditions which occurred during the forming of the film, such as temperature, and the grain size of the grown film. For this reason, the manufacturing process of a semiinsulator film having desired characteristics is difficult which respect to reproduceability and controllability.

The semiinsulator film of this type is not used for other portions of the semiconductor element so that it cannot be formed simultaneously with the other component elements, thus increasing the manufacturing cost which contradicts to the advantage of manufacturing an integrated circuit.

Furthermore, the semiinsulator film has a defect in that its electrical characteristics vary with time due to its crystal structure when it is subjected to a strong electric field of about 1 MV/cm at a temperature of about 100° C. for about 100–1,000 hours. When the resistivity of the semiinsulator film increases, the voltage resistance characteristic across the PNPN semiconductor switch shown in FIG. 1A perfectly disappears, whereas when the resistivity decreases, leakage currents through the switch increase. For this reason, the use of the semiinsulator film decreases the reliability of the semiconductor switch. Especially, the aging of the characteristics of the semiinsulator film has an adverse effect on the PNPN semiconductor switch for use in a telephone exchange.

When a semiinsulator film is used, a response time that prevents formation of a depletion layer immediately beneath the semiinsulator film is slow so that the semiinsulator film has substantially the same effect as an insulating film for a high frequency signal having a frequency of higher than several tens of KHz or a transient signal so that its voltage resistant ability is low whereby a transient current momentarily flows.

Accordingly, where a semiinsulator film is used, it has been extremely difficult to readily manufacture at a high yield a reliable planar type PNPN semiconductor switch having a high voltage resistance characteristic between the anode and cathode electrodes of more than 500 V.

SUMMARY OF THE INVENTION

Accordingly, it is the principal object of this invention to provide a planar type PNPN semiconductor switch having a high reliability and which can be manufactured readily without using a semiinsulator film, and yet can maintain a high dv/dt capability, a high voltage resistance characteristic, and a high drive sensitivity.

Another object of this invention is to provide an improved planar type PNPN semiconductor switch capable of readily limiting the extent of a depletion layer.

According to this invention, these and further objects can be accomplished by providing a planar type PNPN semiconductor switch comprising an N type monocrystalline semiconductor substrate acting as an N gate region; an anode region formed by diffusing a P type impurity into a surface of said semiconductor substrate; a P gate region spaced a predetermined distance from said anode region and formed by diffusing a P type impurity into the surface of said semiconductor substrate; a combined source and cathode region formed by diffusing an N type impurity into a surface of said P gate region; a drain region spaced a predetermined distance from said combined source and cathode region and formed by diffusing an N type impurity into said P gate region; a first gate electrode formed above said P gate region between said drain region and said combined source and cathode region via a first gate insulating film; a second gate electrode overlying said first gate electrode via a second gate insulating film; an anode electrode in ohmic contact with said anode region; a resistor connected between said first gate electrode and a P gate electrode in ohmic contact with said P gate region and said drain region; a field plate electrode disposed in an insulating layer on said substrate between said anode region and said P gate region for preventing the extension of a depletion layer from said anode region to said P gate region; and a conductive layer disposed over said insulating layer for electrically interconnecting said anode electrode and said second gate electrode.

BRIEF DESCRIPTION OF THE DRAWINGS

In the accompanying drawings:

FIG. 1A is a sectional view showing a prior art PNPN semiconductor switch;

FIG. 1B shows the equivalent circuit of the semiconductor switch shown in FIG. 1A;

FIGS. 3A and 3B are sectional views for explaining the off voltage resistance characteristic of the PNPN semiconductor switch of the first embodiment of this invention;

FIG. 4 is a sectional view showing the second embodiment of the PNPN semiconductor switch of this invention;

FIG. 5A is a plan view showing a third embodiment of this invention; and

FIG. 5B is a sectional view taken along a line VB—VB in FIG. 5A.

DESCRIPTION OF THE PREFERRED EMBODIMENTS

Figure 2A:
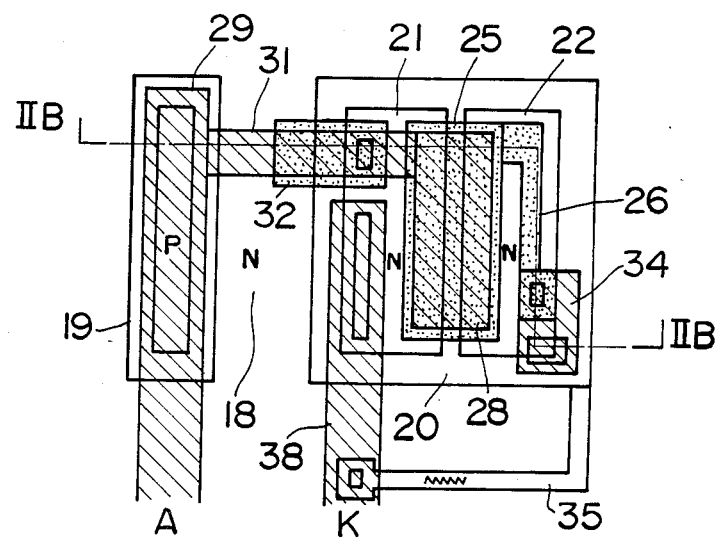
FIG. 2A is a plan view showing a first embodiment of the PNPN semiconductor switch according to this invention.
Figure 2B:
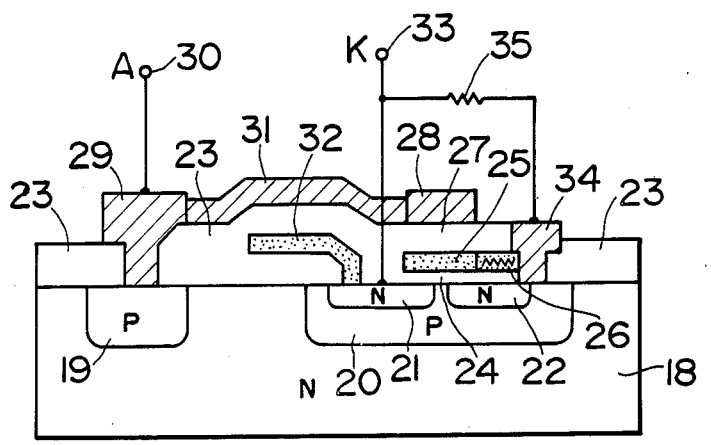
FIG. 2B is a sectional view taken along a line IIB—IIB in FIG. 2A.
Figure 2C:
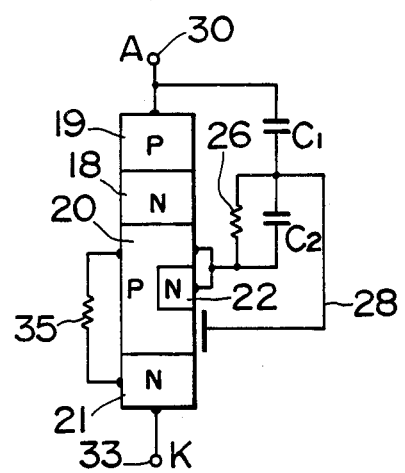
FIG. 2C is an equivalent circuit of the semiconductor switch shown in FIGS. 2A and 2B.

A first embodiment of this invention shown in FIGS. 2A and 2B comprises an N type silicon substrate (N type monocrystalline silicon substrate) 18 acting as an N gate region, and a P type diffused region 19 acting as an anode region and formed at a predetermined portion of the surface of the substrate by diffusing a P type impurity. A P type diffused region 20 acting as a P gate region 20 is formed in the N type silicon substrate 18 at a portion spaced a predetermined distance from the P type diffused region 19 by diffusing a P type impurity. An N type diffused region 21 acting as the cathode region and the source region of a MOS FET is formed in a pre determined portion of the surface of the P type diffused region 20 by diffusing an N type impurity. An N type diffused region 22 acting as the drain region of the MOS FET is formed by diffusing an N type impurity into a portion in the P type diffused region 20, said region 22 being spaced a predetermined distance from the N type diffused region 21. An insulating film 23 made of $SiO_2$, for example, is applied onto a desired portion of the surface of the N type silicon substrate 18 formed with the diffused regions 19, 20, 21 and 22. The portion 24 of the insulating film overlying the P type diffused region 20 between the N type diffused regions 21 and 22 and partially extending on the N type diffused regions 21 and 22 is herein termed a first gate insulating layer 24. On the first gate insulating layer 24 and between the N type diffused regions 21 and 22 is disposed a polycrystalline silicon gate electrode 25 (first gate electrode) made of N type polycrystalline silicon and acting as the gate electrode of the MOS FET. Furthermore, on the first gate insulating layer 24 is disposed a resistor 26 also made of N type polycrystalline silicon and is in electrical contact with the polycrystalline silicon gate electrode. A second gate insulating layer 27 made of $SiO_2$, for example, is disposed on the polycrystalline silicon gate electrode 25 and the resistor 26. An aluminum gate electrode 28 (second gate electrode) is disposed on the second gate electrode layer 27 above the polycrystalline silicon gate electrode 25. An anode electrode 29 is provided on the P type diffused region 19 in ohmic contact therewith. The anode electrode 29 is connected to an anode terminal 30, and an aluminum conductor 31 is formed on the insulating film 23 between the anode electrode 29 and the aluminum gate electrode 28. The aluminum conductor 31 electrically interconnects the anode electrode 29 and the aluminum gate electrode 28. A polycrystalline silicon field plate electrode 32 is embedded in the insulating film 23 between the aluminum conductor 31 and the N type silicon substrate 18. One end of the field plate electrode 32 is in ohmic contact with the N type diffused region 21, while the other end of it extends over the middle portion of the substrate 18 between the P type regions 19 and 20. As can be noted from FIG. 2A, a cathode electrode 38 is electrically coupled to the N type diffused region 21 and connected to a cathode terminal 33. A P gate electrode 34 is provided to electrically contact the P type diffused region 20 and the N type diffused region 22. The resistor 26 is disposed to electrically interconnect the P gate electrode 34 and the polycrystalline silicon gate electrode 25. A shunt resistor 35 formed over the N type substrate 18 is connected between the P gate electrode 34 and the cathode terminal 33.

With the construction described above, a capacitor $C_1$ is formed between the aluminum gate electrode 28 and the polycrystalline silicon gate electrode 25, and a capacitor $C_2$ is formed between the polycrystalline silicon gate electrode 25 and the diffused regions 20, 21 and 22.

The P type diffused region 19, the N type silicon substrate 18, the P type diffused region 20 and the N type diffused region 21 constitute a PNPN semiconductor element.

A two layer gate MOS FET is constituted by the aluminum gate electrode 28 and the polycrystalline silicon gate electrode 25 which act as two layer gate electrodes, the N type diffused region 21 acting as the source region, the N type diffused region 22 acting as the drain region and the P type diffused layer 20 acting as the substrate. In this two layer gate MOS FET, the P gate electrode 34, the polycrystalline silicon resistor 26, and capacitors $C_1$ and $C_2$ constitute MOS associated circuitry.

The off voltage resistance characteristic of the PNPN semiconductor switch described above will now be described.

Under a forward bias condition wherein the anode terminal 30 is supplied with a bias more positive than that of the cathode terminal 33, the depletion layer extends as shown in FIG. 3A. At this time, the depletion layer D1 is formed along a PN junction between the P type diffused region 20 and the N type silicon substrate 18. Due to the field plate electrode 32, a portion of the depletion layer D1 extends towards the P type diffused region 19, but at a portion beyond the end of the field plate electrode 32, the extension of the depletion layer D1 is limited by the electric field created by the aluminum conductor 31 having a potential opposite to that of the electrode 32 so that it does not reach the P type diffused region 19 or punchthrough. Thus, this PNPN semiconductor switch has a high voltage resistance characteristic in the forward direction.

The reverse bias condition will now be discussed. Due to the presence of the shunt resistor 35, the depletion layer D2 as shown in FIG. 3B is formed at the junction between the P type diffused region 19 and the N type silicon substrate 18. Due to the influence of the aluminum conductor 31, a portion of the depletion layer D2 extends toward the P type diffused region 20 but when the depletion layer D2 tends to extend beyond one end of the field plate electrode 32, the extension of the depletion layer is prevented by the electric field created by the field plate electrode 32 having a potential opposite to that of the aluminum conductor 31, whereby punchthrough to the P type diffused region 20 does not occur. Thus, the PNPN semiconductor switch also has a high voltage resistance characteristic in the reverse direction.

As can be noted from the foregoing description, the semiconductor switch of the first embodiment always has a high voltage resistance characteristic without using a semiinsulator film which has been difficult to manufacture.

The same drive sensitivity characteristic and the dv/dt characteristic can be obtained as has been described with reference to FIG. 1.

As described above, according to the first embodiment, a polycrystalline silicon field plate 32 having the same potential as the cathode electrode 38 is provided beneath the aluminum conductor 31 interconnecting the anode electrode 29 and the aluminum gate electrode 28 of the MAC and since the electrode 32 prevents degradation of the voltage resistance characteristic caused by the punchthrough phenomenon due to the conductor 31, the high dv/dt durability and the high drive sensitivity of the semiconductor switch can both be attained, thus providing a PNPN semiconductor switch having a high voltage resistance characteristic, a high dv/dt durability and a high drive sensitivity. Furthermore, it is possible to decrease the number of manufacturing steps because the polycrystalline silicon field plate electrode 32 can be formed concurrently with the polycrystalline silicon gate electrode 25 and the polycrystalline silicon resistor 26 constituting the MAC. Since a semiinsulator film having unstable characteristics is not used, the manufacturing conditions of the semiconductor switch can be improved. The device for preventing degradation of the voltage resistance property provided by the polycrystalline silicon field plate electrode 32 is also effective for high frequency signals and transient voltages. Moreover, as there is no problem of aging, the reliability of the semiconductor switch can be improved. Thus, according to the first embodiment, it is possible to manufacture, at a high yield, a reliable planar type PNPN semiconductor switch having an anode to cathode voltage resistance characteristic of more than 500 V.

Although in the first embodiment, the aluminum gate electrode 28 is electrically connected to the anode electrode 29 via the aluminum conductor 31, the aluminum gate electrode 28 may be electrically connected to the N type silicon substrate 18.

Furthermore, the resistor 26 was shown to electrically interconnect the polycrystalline silicon gate electrode 25 and the P gate electrode 34, but it may electrically interconnect the polycrystalline silicon gate electrode 25 and the cathode electrode 38.

Furthermore, the polycrystalline silicon field plate electrode 32 was connected to the N type diffused region 21 (cathode electrode 38) so as to have the same potential; however, the electrode 32 may be in ohmic contact to the P type diffused region 20 so as to have the same potential and to thereby attain the same object. Such modification constitutes the second embodiment of this invention shown in FIG. 4 in which elements corresponding to those of the first embodiment are designated by the same reference numerals. The operation and effect of the second embodiment are the same as those of the first embodiment.

In the first and second embodiments, the polycrystalline silicon field electrode 32 acts as a shielding member for the conductor between the anode electrode and the aluminum gate electrode. But it is also possible to arrange the field plate electrode 32 at the interface between the P gate region 20 and the N type silicon substrate 18. Alternatively, when the field plate electrode is formed at the interface between the anode region 19 and the N type silicon substrate 18 by utilizing a portion of the aluminum wiring conductor 31, a PNPN semiconductor switch having the same characteristic as the first embodiment can be obtained with a P type diffused region 19 having a smaller thickness.

FIGS. 5A and 5B illustrate this modification, that is the third embodiment of this invention. In this embodiment, the same reference numbers as ones in FIGS. 1 through 4 represent the same portions and functions. The polycrystalline silicon field plate electrodes 32 and 36 are embedded in the insulating layer 23 so as to surround over all the PN junction between the N type substrate 18 and the P gate region 20. An aluminum electrode 37 extends from the anode electrode 29 and is disposed along the PN junction formed between the N type substrate 18 and the anode region 19.

The voltage resistant characteristic of the third embodiment is as follows. When a forward bias voltage is impressed, the depletion layer is formed at the PN junction between the P type diffused region 20 and the N type silicon substrate 18, but due to the influence of the polycrystalline silicon field plate electrodes 32 and 36, the depletion layer extends along the surface of the N type substrate to decrease the field intensity in the depletion layer at the surface so that a high voltage resistance characteristic can be obtained even with a smaller depth of the P type diffused layer. In the same manner as in the first embodiment, the provision of the aluminum conductor 31 prevents punch-through of the depletion layer to the P type diffused region 19.

Like the first embodiment, upon application of a reverse bias voltage, the depletion layer is formed at the PN junction between the P type diffused region 19 and the N type silicon substrate 18, but due to the influence of the aluminum conductor 31 and the aluminum electrode 37, the depletion layer extends along the surface of the silicon substrate so as to decrease the intensity of the electric field in the depletion layer at the surface whereby a high voltage resistance characteristic can be obtained even with a shallow P type diffused layer. Like the first embodiment, the provision of the polycrystalline silicon field plate electrode 32 prevents the depletion layer from forming a punchthrough to the P type diffused layer 20.

As above described according to the third embodiment, the thickness of the P type diffused layer can be made shallower than that of the first embodiment, thus simplifying the manufacturing step. Like the first embodiment, the third embodiment does not require any additional manufacturing step.

Although in the foregoing description certain preferred embodiments of the invention have been described, it should be understood that various changes and modifications will be obvious to one skilled in the art without departing from the true spirit and scope of the invention as defined in the appended claims.

What is claimed is:

1. In a planar type PNPN semiconductor switch comprising:
    an N type monocrystalline semiconductor substrate acting as an N gate region;
    an anode region formed by diffusing a P type impurity into a surface of said semiconductor substrate;
    a P gate region spaced from said anode region by a predetermined distance and formed by diffusing a P type impurity into the surface of said semiconductor substrate;
    a combined source and cathode region formed by diffusing an N type impurity into a surface of said P gate region;
    a drain region spaced from said combined source and cathode region by a predetermined distance and formed by diffusing an N type impurity into said P gate region;
    a first gate electrode formed above said P gate region between said drain region and said combined source and cathode region via a first gate insulating layer;
    a second gate electrode formed over said first gate electrode via a second insulating layer;
    an anode electrode which is in ohmic contact with said anode region;
    a resistor arranged over the surface of said substrate and having one end connected to said first gate electrode and having another end connected to both said P gate region and said drain region; and
    a conductive layer disposed on an insulating layer for electrically interconnecting said anode electrode and said second gate electrode;
    the improvement which comprises a polycrystalline silicon field plate electrode extending under said conductive layer and over a PN junction between said P gate region and said N type substrate; one end of said field plate electrode being in contact with said combined source and cathode region and another end of said field plate electrode extending over the surface of said substrate between said anode region and said P gate region; said field plate electrode being isolated from said conductive layer and the surface of said substrate by insulating layers, whereby the extension of a depletion layer from said anode region to said P gate region is prevented.

2. A PNPN semiconductor switch according to claim 1, wherein said field plate electrode is disposed aong said PN junction.

3. In a planar type PNPN semiconductor switch comprising:
    an N type monocrystalline semiconductor substrate acting as an N gate region;
    an anode region formed by diffusing a P type impurity into a surface of said semiconductor substrate;
    a P gate region spaced from said anode region by a predetermined distance and formed by diffusing a P type impurity into the surface of said semiconductor substrate;
    a combined source and cathode region formed by diffusing an N type impurity into a surface of said P gate region;
    a drain region spaced from said combined source and cathode region by a predetermined distance and formed by diffusing an N type impurity into said P gate region;
    a first gate electrode formed above said P gate region between said drain region and said combined source and cathode region via a first gate insulating layer;
    a second gate electrode covering said first gate electrode via a second gate insulating layer;
    an anode electrode which is in ohmic contact with said anode region;
    a resistor arranged over the surface of said substrate and having one end connected to said first gate electrode and having another end conected to both said P gate region and said drain region; and
    a conductive layer disposed on an insulating layer for electrically interconnecting said anode electrode and said second gate electrode;
    the improvement which comprises a polycrystalline silicon field plate electrode extendng under said conductive layer and over a PN junction between said P gate region and said N type substrate; one end of said field plate electrode being in contact with said P gate region and another end of said field plate electrode extending over the surface of said substrate between said anode region and said P gate region; said field plate electrode being isolated from said conductive layer and the surface of said substrate by insulating layers, whereby the extension of a depletion layer from said anode region to said P gate region is prevented.

4. A PNPN semiconductor switch according to claim 3, wherein said field plate electrode is disposed along said PN junction.

* * * * *